(12) United States Patent
Chan et al.

(10) Patent No.: US 12,322,735 B2
(45) Date of Patent: Jun. 3, 2025

(54) DISPLAY PANEL INCLUDING OPAQUE ENCAPSULATION AND DOPED PLANARIZATION LAYERS AND MANUFACTURING METHOD THEREOF

(71) Applicant: Au Optronics Corporation, Hsinchu (TW)

(72) Inventors: Fu-Wei Chan, Hsinchu (TW); Kuan-Hsun Chen, Hsinchu (TW); Yi-Yueh Hsu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 536 days.

(21) Appl. No.: 17/711,050

(22) Filed: Apr. 1, 2022

(65) Prior Publication Data

US 2023/0187417 A1    Jun. 15, 2023

(30) Foreign Application Priority Data

Dec. 10, 2021    (TW) ................. 110146311

(51) Int. Cl.
*H01L 25/075*    (2006.01)
*H01L 25/13*    (2006.01)
(Continued)

(52) U.S. Cl.
CPC .......... *H01L 25/0753* (2013.01); *H01L 25/13* (2013.01); *H10H 20/853* (2025.01);
(Continued)

(58) Field of Classification Search
CPC ..... H01L 25/0753; H01L 25/13; H01L 33/54; H01L 24/80; H01L 2224/80805; H01L 2933/005; H01L 24/08; H01L 2224/08225; H01L 33/62; H01L 33/44; H01L 2933/0091; H01L 33/56; H01L 27/156; H10H 29/142; H10H 20/853; H10H 20/0362; H10H 20/857; H10H 20/854; H10H 20/882; H10H 20/84
See application file for complete search history.

(56) References Cited

U.S. PATENT DOCUMENTS 8,659,106 B2    2/2014  Nishijima et al.
8,987,853 B2    3/2015  Nishijima et al.
(Continued)

FOREIGN PATENT DOCUMENTS

CN    105531829    4/2016
CN    106449937    2/2017
(Continued)

OTHER PUBLICATIONS

English translation of JP2016000831A (Year: 2015).*

*Primary Examiner* — William B Partridge
*Assistant Examiner* — Ilker Ozden
(74) *Attorney, Agent, or Firm* — JCIPRNET

(57) ABSTRACT

A display panel includes a substrate, light-emitting diodes, and a cured opaque encapsulant layer. The light-emitting diodes are disposed on a first surface of the substrate. The cured opaque encapsulant layer is disposed on the first surface and a side surface of the substrate, and surrounds the light emitting diodes. A second surface of the cured opaque encapsulant layer facing away from the substrate is a rough surface.

15 Claims, 9 Drawing Sheets

(51) Int. Cl.
    *H10H 20/01*     (2025.01)
    *H10H 20/853*     (2025.01)
    *H01L 23/00*     (2006.01)

(52) U.S. Cl.
    CPC .............. *H01L 24/08* (2013.01); *H01L 24/80* (2013.01); *H01L 2224/08225* (2013.01); *H01L 2224/80805* (2013.01); *H10H 20/0362* (2025.01)

(56) References Cited

U.S. PATENT DOCUMENTS

| | | | |
|---|---|---|---|
| 9,640,709 B2 | 5/2017 | Gubser et al. | |
| 10,672,848 B2 | 6/2020 | Lee et al. | |
| 10,741,736 B2 | 8/2020 | Gubser et al. | |
| 10,748,880 B2 | 8/2020 | Chen et al. | |
| 10,985,229 B2 | 4/2021 | Lee et al. | |
| 11,145,796 B2 | 10/2021 | Gubser et al. | |
| 11,942,580 B2 | 3/2024 | Gubser et al. | |
| 2014/0027709 A1* | 1/2014 | Higginson | H01L 33/44 257/13 |
| 2016/0293811 A1* | 10/2016 | Hussell | H01L 33/52 |
| 2018/0053815 A1* | 2/2018 | Lee | H01L 27/3258 |
| 2019/0115329 A1* | 4/2019 | Min | |
| 2019/0304958 A1 | 10/2019 | Chen et al. | |
| 2020/0083397 A1* | 3/2020 | Lee | H01L 33/00 |
| 2020/0312819 A1* | 10/2020 | Shao | H01L 25/13 |
| 2020/0312883 A1* | 10/2020 | Qu | H01L 27/124 |

FOREIGN PATENT DOCUMENTS

| | | | | |
|---|---|---|---|---|
| CN | 107438899 | | 12/2017 | |
| CN | 111162157 | | 5/2020 | |
| CN | 113690225 | | 11/2021 | |
| JP | 2016000831 A | * | 9/2015 | ... H01L 2224/16225 |
| KR | 20180021286 | | 3/2018 | |
| TW | 201943065 | | 11/2019 | |
| TW | I753762 | | 1/2022 | |

* cited by examiner

DISPLAY PANEL INCLUDING OPAQUE ENCAPSULATION AND DOPED PLANARIZATION LAYERS AND MANUFACTURING METHOD THEREOF

CROSS-REFERENCE TO RELATED APPLICATION

This application claims priority benefits of Taiwan patent application serial no. 110146311, filed on Dec. 10, 2021. The entirety of the above-mentioned patent application is hereby incorporated by reference herein and made a part of this specification.

FIELD OF THE INVENTION

This invention relates to a display panel, and a method for manufacturing the same.

DESCRIPTION OF RELATED ART

Light-emitting diode (LED) is considered to be a good choice for a pixel of a display device, for advantages such as long lifetime, low possibility of breakage, rapid response and high reliability, etc. In usual manufacture of a LED display device, numerous light-emitting diodes are transferred to a circuit substrate by mass transfer technology, and then an encapsulant is used to encapsulate the light-emitting diodes on the circuit substrate.

SUMMARY OF THE INVENTION

This invention provides a display panel that is capable of reducing the problem of light reflection on the display panel surface.

This invention also provides a method for manufacturing a display panel, which is capable of reducing the problem of light reflection on the display panel surface.

The display panel according to some embodiments of this invention includes a substrate, a plurality of light-emitting diodes, and a cured opaque encapsulant layer. The light-emitting diodes are disposed on a first surface of the substrate. The cured opaque encapsulant layer is disposed on the first surface and a side surface of the substrate, and surrounds the light emitting diodes. A second surface of the cured opaque encapsulant layer facing away from the substrate is a rough surface.

The method for manufacturing a display panel according to some embodiments of this invention includes the following steps. A plurality of light-emitting diodes is disposed on a first surface of a substrate. An opaque encapsulant layer is provided on the first surface and a side surface of the substrate, wherein the opaque encapsulant layer covers the light-emitting diodes. The opaque encapsulant layer is cured to form a cured opaque encapsulant layer, wherein the cured opaque encapsulant layer surrounds the light-emitting diodes and has a first portion on the side surface of the substrate. An etching process is performed to etch the cured opaque encapsulant layer. After the etching process, a second surface of the cured opaque encapsulant layer facing away from the substrate is a rough surface.

In order to make the above-mentioned features and merits of this invention clearer and more understandable, exemplary embodiments are described in details below in accompany with the attached drawings.

DESCRIPTION OF THE EMBODIMENTS

FIG. 1A to FIG. 1K schematically illustrate, in a cross-sectional view, the method for manufacturing a display panel according to an embodiment of this invention.

Figure 1A:
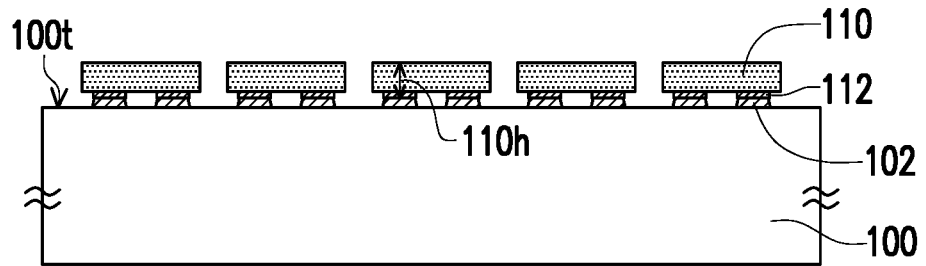
FIG. 1A to FIG. 1K schematically illustrate, in a cross-sectional view, the method for manufacturing a display panel according to an embodiment of this invention.

Referring to FIG. 1A, first, a plurality of light-emitting diodes 110 is disposed on a first surface 100t of a substrate 100. The light-emitting diodes 110 may have been formed on one or more growth substrates (not shown) previously and then transferred onto the first surface 100t of the substrate 100 using a mass transfer technique.

In some embodiments, the light-emitting diodes 110 include light-emitting diodes of different colors, such as red LEDs, green LEDs and blue LEDs. In some other embodiments, the light-emitting diodes 110 are all of the same color. In some embodiments, the thickness 110h of the light-emitting diodes 110 ranges from 5 μm to 80 μm.

In this embodiment, the substrate 100 is a circuit substrate. The substrate 100 may have thereon a plurality of conductive lines (not shown), a plurality of active devices (not shown), a plurality of passive devices (not shown), and a plurality of contact pads 102. The contact pads 102 are disposed on the first surface 100t of the substrate 100. In this embodiment, the electrodes 112 of the light-emitting diodes 110 may be bonded to the contact pads 102 on the substrate 100 through eutectic bonding, but this invention is not limited thereto. In some other embodiments, the light-emitting diodes 110 are bonded to the contact pads 102 on the substrate 100 using an anisotropic conductive adhesive or other conductive structure.

Figure 1B:
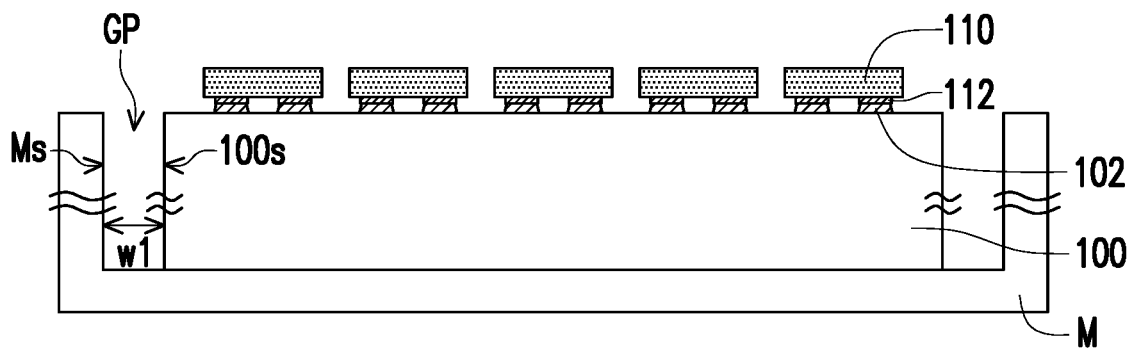

Referring to FIG. 1B, the substrate 100 and the light-emitting diodes 110 are placed in a mold M. In some embodiments, a gap GP is present between the side surface 100s of the substrate 100 and the inner side surface Ms of the mold M. The width w1 of the gap GP may range from 50 μm to 200 μm.

Figure 1C:
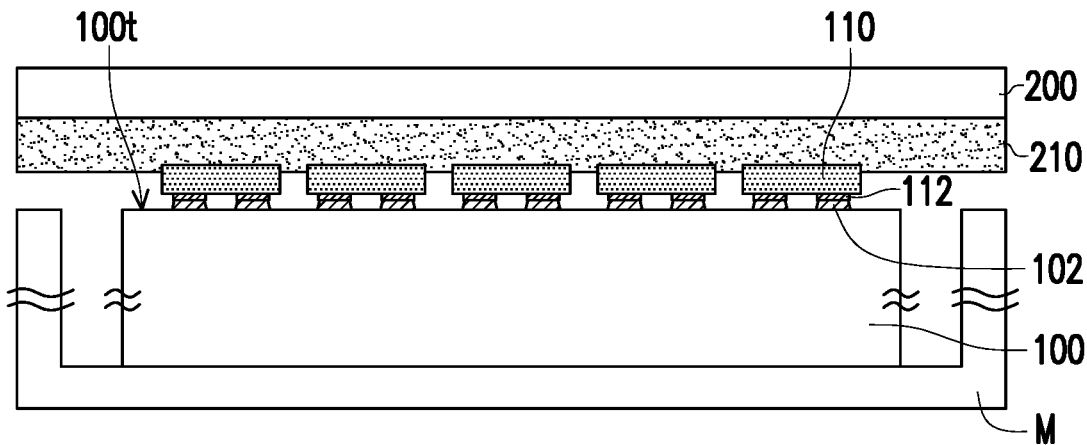

Referring to FIG. 1C, an opaque encapsulant layer 210 is provided on the first surface 100t of the substrate 100, covering the light-emitting diodes 110. In this embodiment, the opaque encapsulant layer 210 may have been formed on a release layer 200 previously and then be attached to the light-emitting diodes 110.

In some embodiments, the opaque encapsulant layer 210 may be a B-stage resin, where B-stage means a semi-cured state. For example, the opaque encapsulant layer 210 may include a resin and a curing agent, wherein the resin and the curing agent have been partially reacted and transformed into a semi-cured state. The opaque encapsulant layer 210 in the B-stage can have properties of low viscosity and high flowability through heating. In addition, by further heating the opaque encapsulant layer 210 in the B-stage, the opaque encapsulant layer 210 can be cured.

Compared with utilizing printing or coating, utilizing a B-stage resin allows the opaque encapsulant layer 210 to be formed on the substrate 100 in a larger thickness, which aids to decrease the vertical distance between the top surface of the opaque encapsulant layer 210 and the top surfaces of the light-emitting diodes 110 and thereby reduces the problem of the later formed layer causing bubbles around the light-emitting diodes 110. Specifically, if the opaque encapsulant layer is formed through printing or coating, the formed opaque encapsulant layer tends to be overly thin so that bubbles are formed in the layer later formed over the light-emitting diodes 110 due to the height difference between the opaque encapsulant layer and the light-emitting diodes 110.

Figure 1D:
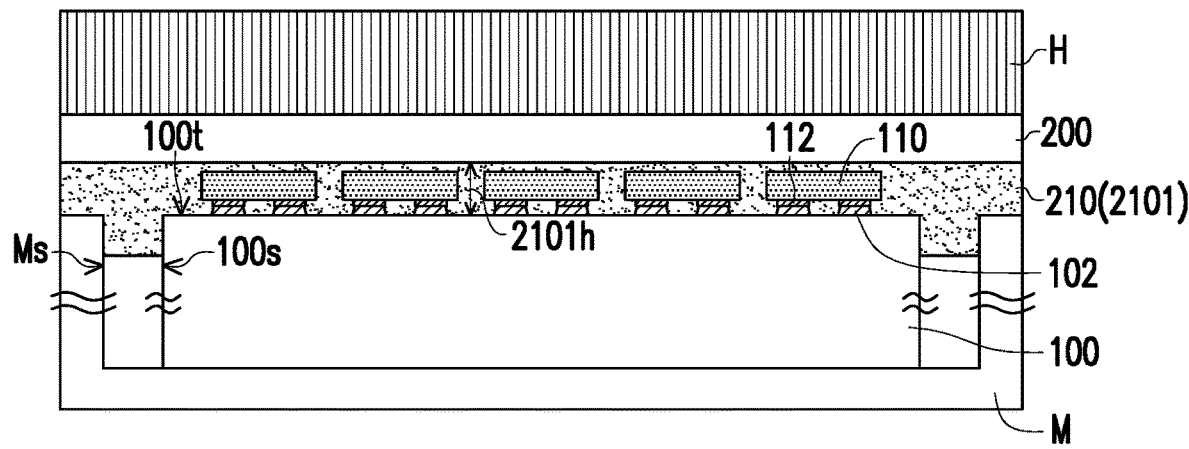

Referring to FIG. 1D, a lamination process is performed for the opaque encapsulant layer 210. For example, a heating head H is used to heat-press the opaque encapsulant layer 210, whereby the opaque encapsulant layer 210 fills in between the light-emitting diodes 110 and the substrate 100. In this embodiment, the opaque encapsulant layer 210 further fills in between the side surface 100s of the substrate 100 and the inner side surface Ms of the mold M while the opaque encapsulant layer 210 is heat-pressed. In some embodiment, the lamination process for the opaque encapsulant layer 210 is performed in vacuum.

In this embodiment, the opaque encapsulant layer 210 may serve as an underfill of the light-emitting diodes 110 to protect the contact parts between the light-emitting diodes 110 and the substrate 100. Specifically, the opaque encapsulant layer 210 surrounds the electrodes 112 of the light-emitting diodes 110 to prevent damage to the electrodes 112 in later processes.

After the opaque encapsulant layer 210 fills in between the light-emitting diodes 110 and the substrate 100 and in between the side surface 100s of the substrate 100 and the inner side surface Ms of the mold M, the opaque encapsulant layer 210 is further heated to be cured, so that a cured opaque encapsulant layer 2101 is formed. The cured opaque encapsulant layer 2101 is disposed on the first surface 100t and the side surface 100s of the substrate 100 and surrounds the light-emitting diodes 110. In this embodiment, a portion of the cured opaque encapsulant layer 2101 is located between the light-emitting diodes 110 and the substrate 100, and another portion of the cured opaque encapsulant layer 2101 is located on the side surface 100s of the substrate 100.

In this embodiment, the cured opaque encapsulant layer 2101 may be a light absorption layer or a combination of a light absorption layer and a reflection layer, wherein the optical density (OD) of the light absorption layer is 3 or more. In this embodiment, because a portion of the cured opaque encapsulant layer 2101 is located on the side surface 100s of the substrate 100, a problem of light leakage at the edges of the display panel can be prevented.

In some embodiments, the thickness 2101h of the cured opaque encapsulant layer 2101 on the first surface 100t of the substrate 100 ranges from 10 μm to 100 μm.

Figure 1E:
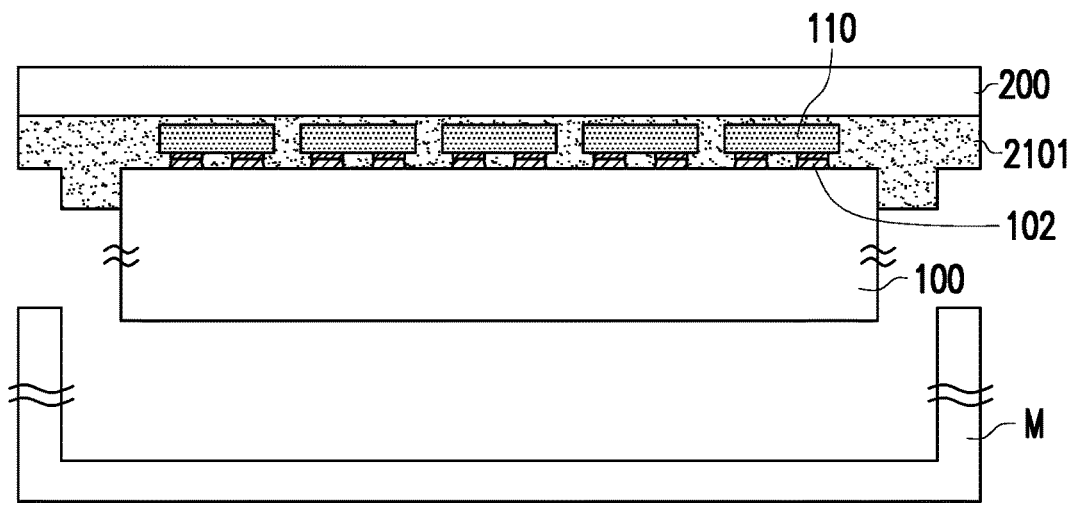

Referring to FIG. 1E, the mold M is removed. This can be carried out by, for example, taking out the release layer 200, the cured opaque encapsulant layer 2101, the light-emitting diodes 110 and the substrate 100 from the mold M.

Figure 1F:
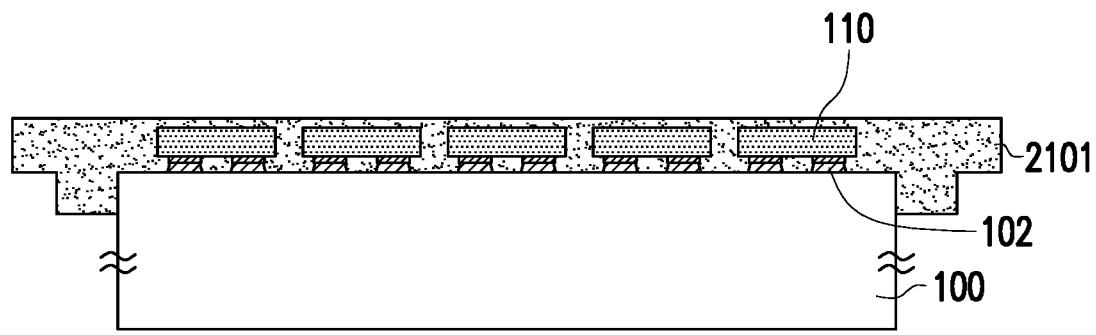

Referring to FIG. 1F, the release layer 200 is removed.

Figure 1G:
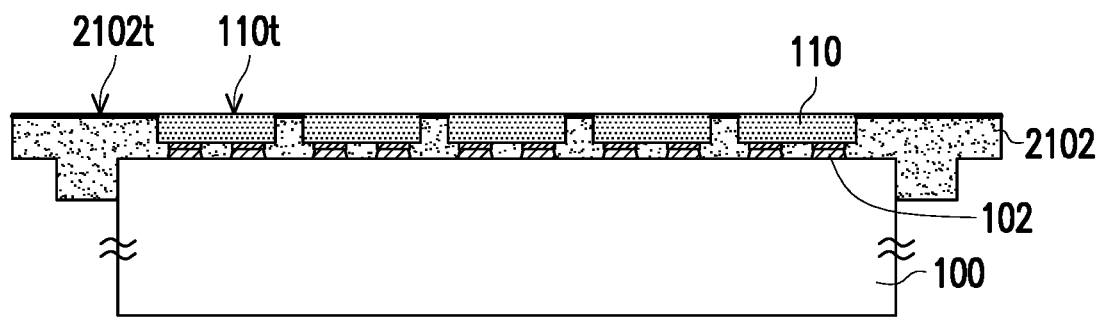

Referring to FIG. 1G, an etching process is then performed to etch the cured opaque encapsulant layer 2101, until the second surface 2102t of the etched cured opaque encapsulant layer 2102 is coplanar with or lower than the top surfaces 110t of the light-emitting diodes 110. The etching process may include a plasma etching process. Through the etching process, the top surfaces 110t of the light-emitting diodes 110 is exposed out of the cured opaque encapsulant layer 2102, and a second surface 2102t of the cured opaque encapsulant layer 2102 facing away from the substrate 100 is a rough surface, which is simply represented by thick straight lines in the figure. In this embodiment, by forming the rough second surface 2102t through etching, the surface haze of the cured opaque encapsulant layer 2102 is increased. In some embodiments, the roughness Ra of the second surface 2102t of the cured opaque encapsulant layer 2102 ranges from 0.1 μm to 2.5 μm. In this embodiment, because the second surface 2102t of the cured opaque encapsulant layer 2102 is a rough surface, the problem of light reflection on the display panel surface can be reduced.

In some embodiments, the second surface 2102t of the cured opaque encapsulant layer 2102 on the first surface 100t of the substrate 100 is substantially coplanar with the top surfaces 110t of the light-emitting diodes 110. Specifically, the second surface 2102t of the cured opaque encapsulant layer 2102 is coplanar with or lower than the top surfaces 110t of the light-emitting diodes 110, wherein a height difference between the second surface 2102t and the top surfaces 110t may range from 0 to 75 μm.

In some embodiments, after the etching process is performed, a cleaning process may optionally be performed to the second surface 2102t of the cured opaque encapsulant layer 2102 to remove the residues generated by the etching process.

Figure 1H:
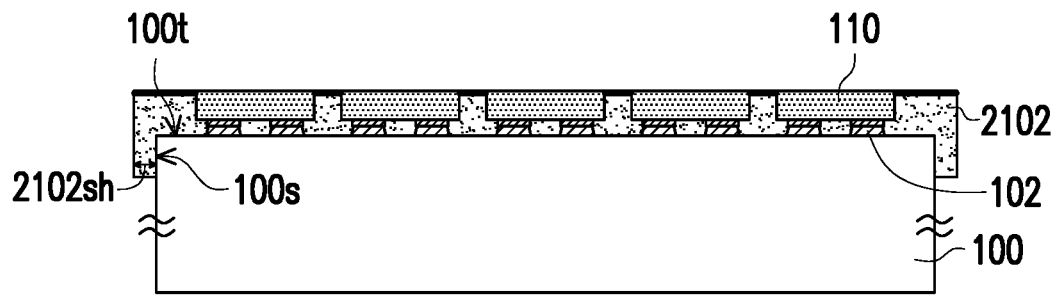

Referring to FIG. 1H, a cutting process is performed to remove excess part of the cured opaque encapsulant layer 2102. In some embodiments, the cutting process may include a laser cutting process or other suitable process.

In this embodiment, after the cutting process, a portion of the cured opaque encapsulant layer 2102 on the side surface 100s of the substrate 100 is retained, so is the cured opaque encapsulant layer 2102 on the first surface 100t of the substrate 100. The thickness 2102sh of the remaining cured opaque encapsulant layer 2102 on the side surface 100s of the substrate 100 may range from 10 μm to 250 μm.

In this embodiment, the cutting process reduces the thickness 2102sh, but this invention is not limited thereto.

Figure 1I:
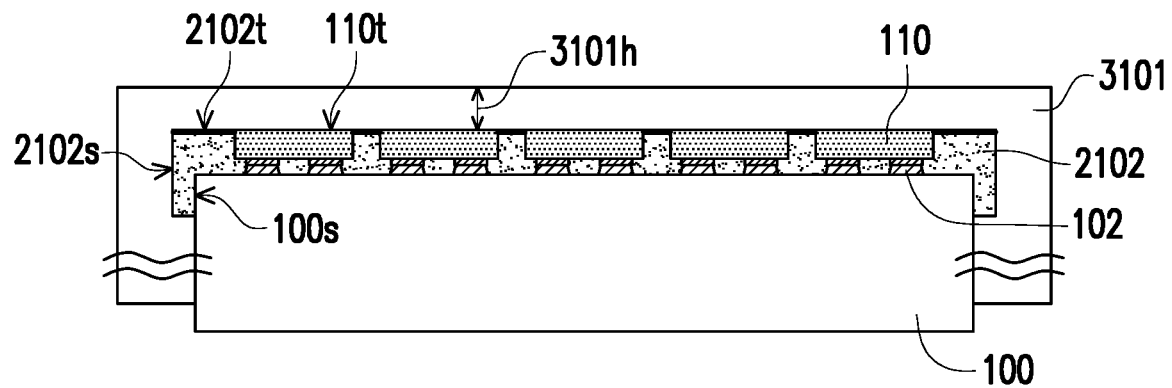

Referring to FIG. 1I, a transparent planarization layer 3101 is formed on cured opaque encapsulant layer 2102. In some embodiments, the transparent planarization layer 3101 may be formed in a process similar to the process of forming the cured opaque encapsulant layer 2101 as shown in FIGS. 1C to 1F. However, this invention is not limited thereto, and the transparent planarization layer 3101 may alternatively be formed by other suitable process. In some embodiments, the transparent planarization layer 3101 is optionally doped with black particles, wherein the content of the black particles is within a range of 0 weight % to 0.5 weight %. For example, the transparent planarization layer 3101 includes a matrix material and black particles dispersed in the matrix material. The matrix material may be an epoxy resin, a silicone resin or other resin material, for example. The black particles are distributed in the matrix material. In some embodiments, the black particles include carbon, chromium, a light absorption dye like those used in light filtering devices, or other light absorption material.

In some embodiments, the cured opaque encapsulant layer 2102 also includes a matrix material and black particles dispersed in the matrix material, and the cured opaque encapsulant layer 2102 and the transparent planarization layer 3101 may include identical materials. The cured opaque encapsulant layer 2102 is different from the transparent planarization layer 3101 in having a higher content of the black particles.

The transparent planarization layer 3101 covers and contacts with the top surfaces 110t of the light-emitting diodes 110, the second surface 2102t of the cured opaque encapsulant layer 2102, the side surface 2102s of the cured opaque encapsulant layer 2102, and the side surface 100s of the substrate 100. The thickness 3101h of the transparent planarization layer 3101 on the first surface 100t of the substrate 100 ranges from 10 μm to 100 μm.

In this embodiment, because the second surface 2102t of the cured opaque encapsulant layer 2102 on the first surface 100t of the substrate 100 is substantially coplanar with the top surfaces 110t of the light-emitting diodes 110, bubbles are difficult to form between the transparent planarization layer 3101 and the cured opaque encapsulant layer 2102. In addition, by including the transparent planarization layer 3101, it is possible to prevent moisture from entering the display panel from the edges of the display panel.

Figure 1J:
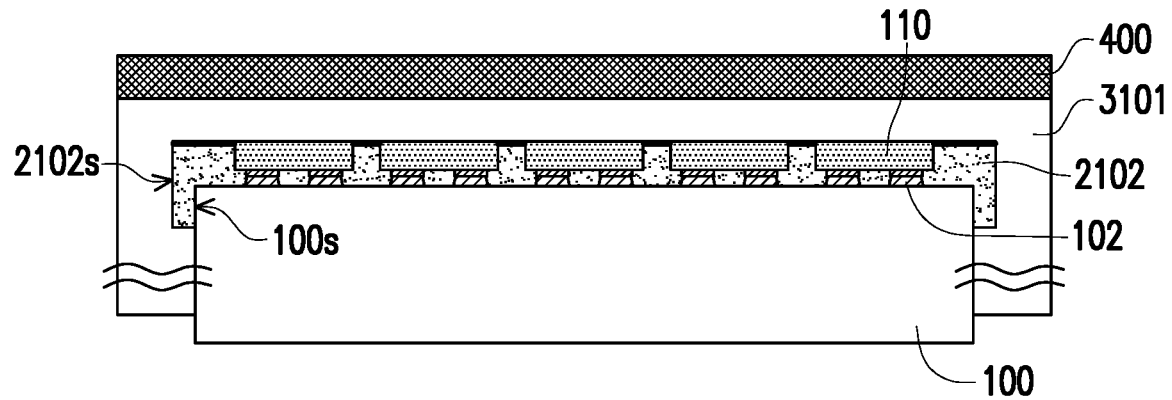

Referring to FIG. 1J, an optical film 400 is formed on the transparent planarization layer 3101. The optical film 400 may be, for example, a polarization film, an anti-glare film, an anti-reflection film, or other suitable optical film.

Figure 1K:
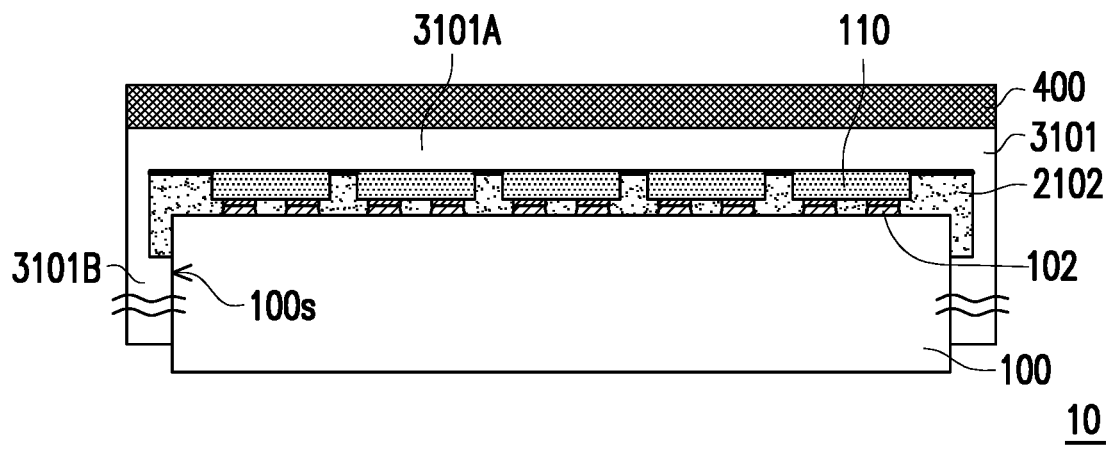

Referring to FIG. 1K, a cutting process is performed to the optical film 400 and the transparent planarization layer 3101, so that a display panel 10 is obtained. In this embodiment, the cured opaque encapsulant layer 2102 is not cut while the optical film 400 and the transparent planarization layer 3101 are cut.

In this embodiment, the transparent planarization layer 3101 includes a first portion 3101A and a second portion 3101B. The first portion 3101A of the transparent planarization layer 3101 covers the second surface 2102t of the cured opaque encapsulant layer 2102 and the top surfaces 110t of the light-emitting diodes 110. The second portion 3101B of the transparent planarization layer 3101 is located on the side surface 100s of the substrate 100, and covers the portion of the cured opaque encapsulant layer 2102 on the side surface 100s of the substrate 100. In this embodiment, the first portion 3101A and the second portion 3101B of the transparent planarization layer 3101 are connected to each other.

Figure 2:
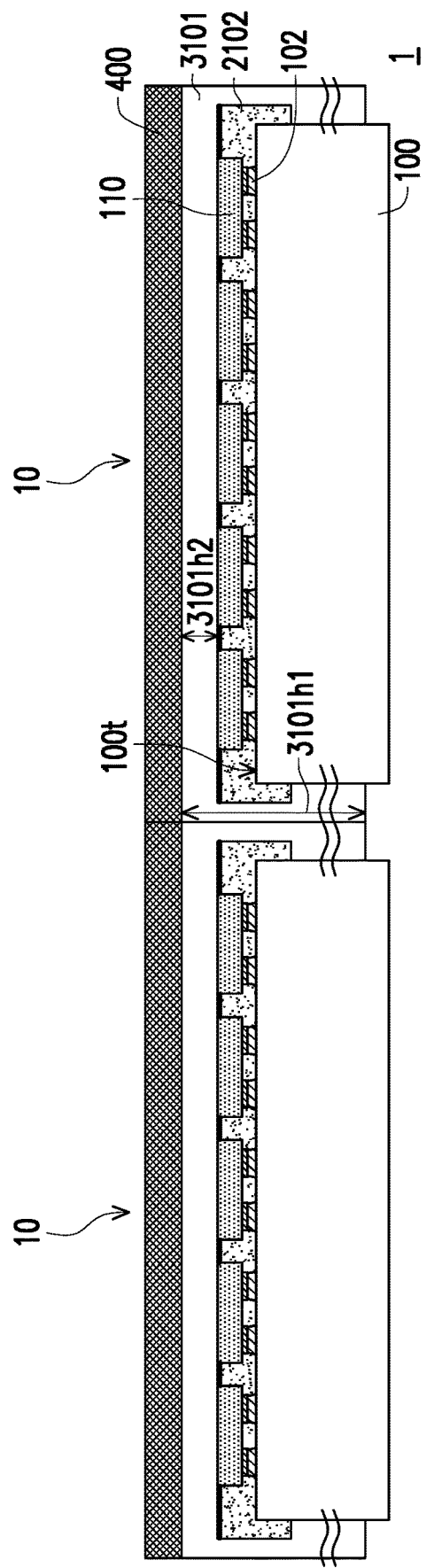
FIG. 2 schematically illustrates, in a cross-sectional view, a tiled display apparatus according to an embodiment of this invention.

FIG. 2 schematically illustrates, in a cross-sectional view, a tiled display apparatus according to an embodiment of this invention.

Referring to FIG. 2, a tiled display apparatus 1 is obtained by tiling a plurality of the display panels 10. The display panels 10 is tiled together using, for example, a back frame (not shown) or other member.

In this embodiment, the transparent planarization layers 3101 of adjacent display panels 10 contact with other. To prevent occurrence of light leakage at joints of the display panels 10, the transparent planarization layers 3101 is doped with black particles. In this embodiment, in the direction of front view, the thickness 3101h1 of the transparent planarization layers 3101 at the joints of the display panels 10 is larger than the thickness 3101h2 of the same on the first surfaces 100t of the substrates 100. Therefore, by adjusting the content of the black particles in the transparent planarization layers 3101, the thicker portions of the transparent planarization layers 3101 having the thickness 3101h1 can be made opaque while the thinner portions of the transparent planarization layers 3101 having the thickness 3101h2 are still transparent. In some embodiments, the content of the black particles in the transparent planarization layers 3101 is within the range of 0 weight % to 0.5 weight %.

Figure 3:
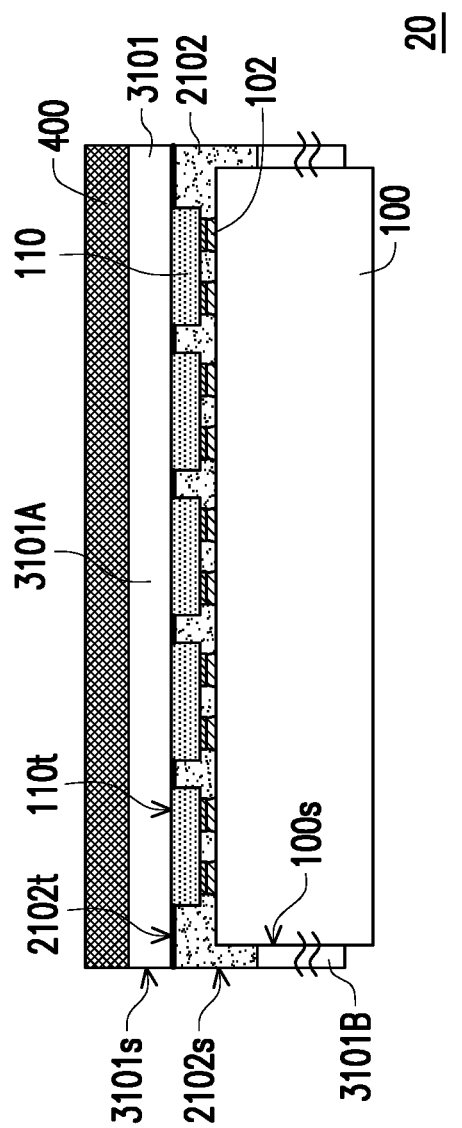
FIG. 3 schematically illustrates, in a cross-sectional view, a display panel according to another embodiment of this invention.

FIG. 3 schematically illustrates, in a cross-sectional view, a display panel according to another embodiment of this invention. It is particularly noted that the reference characters of elements and related contents in the embodiment as shown in FIGS. 1A to 1K are continued to be used, identical or similar reference characters are used to represent identical or similar elements, and descriptions of identical technical contents are omitted, in this embodiment. The omitted descriptions may refer to the embodiment as shown in FIGS. 1A to 1K.

The display panel 20 as shown in FIG. 3 is different from the display panel 10 as shown in FIG. 1K mainly in that the side surface 3101s of the transparent planarization layer 3101 is coplanar with the side surface 2102s of the cured opaque encapsulant layer 2102 after the cutting process is performed to the optical film 400 and the transparent planarization layer 3101, wherein cutting of the cured opaque encapsulant layer 2102 is optional in the cutting process.

Referring to FIG. 3, in this embodiment, the transparent planarization layer 3101 includes a first portion 3101A and a second portion 3101B. The first portion 3101A of the transparent planarization layer 3101 covers the second surface 2102t of the cured opaque encapsulant layer 2102 and the top surfaces 110t of the light-emitting diodes 110. The second portion 3101B of the transparent planarization layer 3101 is located on the side surface 100s. In this embodiment, the portion of the cured opaque encapsulant layer 2102 on the side surface 100s of the substrate 100 is located between the first portion 3101A and the second portion 3101B of the transparent planarization layer 3101, and the transparent planarization layer 3101 does not cover the side surface 2102s of the portion of the cured opaque encapsulant layer 2102 on the side surface 100s of the substrate 100. In this embodiment, the first portion 3101A and the second portion 3101B are separate from each other.

Figure 4:
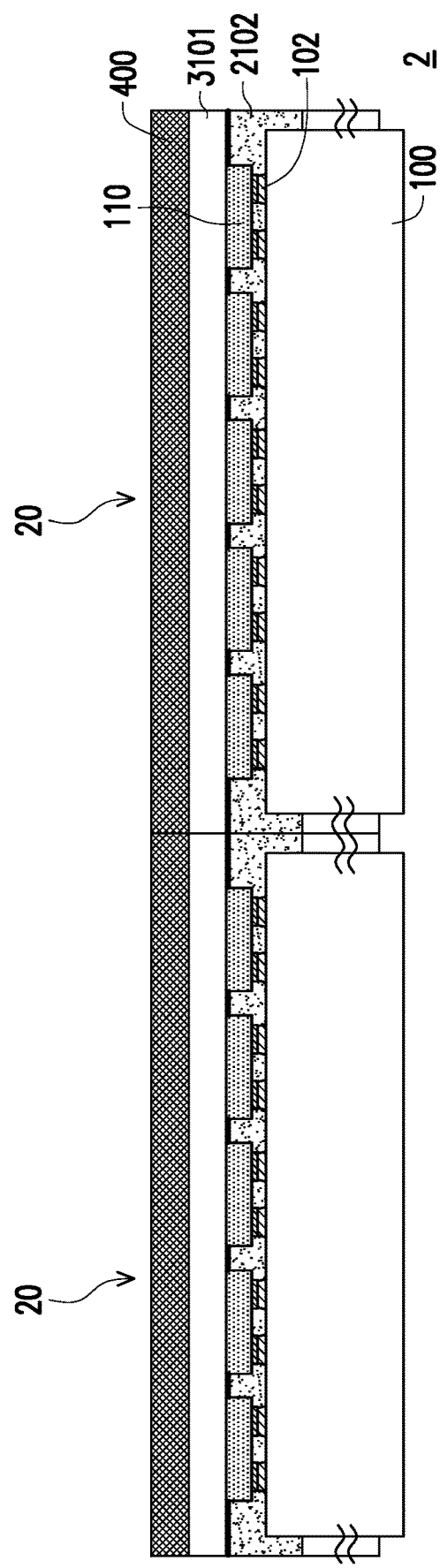
FIG. 4 schematically illustrates, in a cross-sectional view, a tiled display apparatus according to another embodiment of this invention.

FIG. 4 schematically illustrates, in a cross-sectional view, a tiled display apparatus according to another embodiment of this invention.

Referring to FIG. 4, a tiled display apparatus 2 is obtained by tiling a plurality of the display panels 20. The display panels 20 is tiled together using, for example, a back frame (not shown) or other member.

In this embodiment, the cured opaque encapsulant layers 2102 of adjacent display panels 20 contact with other. Thereby, occurrence of light leakage at the joints of the display panels 20 can be prevented in the tiled display apparatus 2 without doping black particles in the transparent planarization layer 3101.

Figure 5:
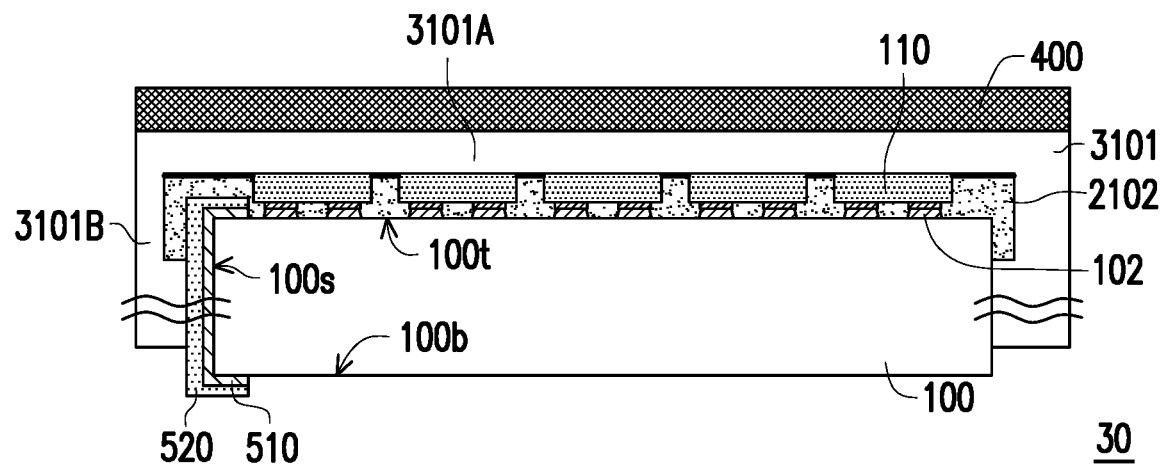
FIG. 5 schematically illustrates, in a cross-sectional view, a display panel according to still another embodiment of this invention.

FIG. 5 schematically illustrates, in a cross-sectional view, a display panel according to still another embodiment of this invention. It is particularly noted that the reference characters of elements and related contents in the embodiment as shown in FIGS. 1A to 1K are continued to be used, identical or similar reference characters are used to represent identical or similar elements, and descriptions of identical technical contents are omitted, in this embodiment. The omitted descriptions may refer to the embodiment as shown in FIGS. 1A to 1K.

The display panel 30 as shown in FIG. 5 is different from the display panel 10 as shown in FIG. 1K mainly in further including a side trace 510 and a passivation layer 520.

Referring to FIG. 5, the side trace 510 is mainly formed on the side surface 100s of the substrate 100. In this embodiment, the side trace 510 extends from the first surface 100t of the substrate 100 to the second surface 100b of the substrate 100 along the side surface 100s of the substrate 100, wherein the second surface 100b is opposite to the first surface 100t. In this embodiment, the side trace 510 is electrically connected with wiring (not shown) on the first surface 100t of the substrate 100 and also electrically connected with a chip, a circuit board or other circuit structure on the second surface 100b of the substrate 100.

The passivation layer 520 covers the side trace 510. The portion of the cured opaque encapsulant layers 2102 on the side surface 100s of the substrate 100 covers a part of the side trace 510 and a part of the passivation layer 520. The portion of the transparent planarization layer 3101 on the side surface 100s of the substrate 100 (for example, the second portion 3101B of the transparent planarization layer 3101) covers a part of the side trace 510 and a part of the passivation layer 520.

Figure 6:
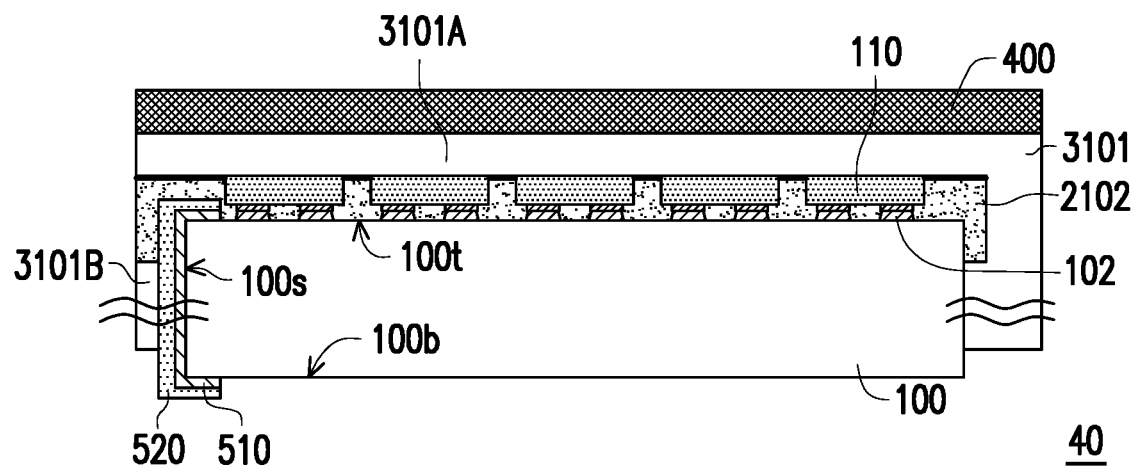
FIG. 6 schematically illustrates, in a cross-sectional view, a display panel according to yet another embodiment of this invention.

FIG. 6 schematically illustrates, in a cross-sectional view, a display panel according to yet another embodiment of this invention. It is particularly noted that the reference characters of elements and related contents in the embodiment as shown in FIGS. 1A to 1K are continued to be used, identical or similar reference characters are used to represent identical or similar elements, and descriptions of identical technical contents are omitted, in this embodiment. The omitted descriptions may refer to the embodiment as shown in FIGS. 1A to 1K.

The display panel 40 as shown in FIG. 6 is different from the display panel 20 as shown in FIG. 3 mainly in further including a side trace 510 and a passivation layer 520.

Referring to FIG. 6, the side trace 510 is mainly formed on the side surface 100s of the substrate 100. In this embodiment, the side trace 510 extends from the first surface 100t of the substrate 100 to the second surface 100b of the substrate 100 along the side surface 100s of the substrate 100, wherein the second surface 100b is opposite to the first surface 100t. In this embodiment, the side trace 510 is electrically connected with wiring (not shown) on the first surface 100t of the substrate 100 and also electrically connected with a chip, a circuit board or other circuit structure on the second surface 100b of the substrate 100.

The passivation layer 520 covers the side trace 510. The portion of the cured opaque encapsulant layer 2102 on the side surface 100s of the substrate 100 covers a part of the side trace 510 and a part of the passivation layer 520. The portion of the transparent planarization layer 3101 on the side surface 100s of the substrate 100 (for example, the second portion 3101B of the transparent planarization layer 3101) covers a part of the side trace 510 and a part of the passivation layer 520.

Figure 7A:
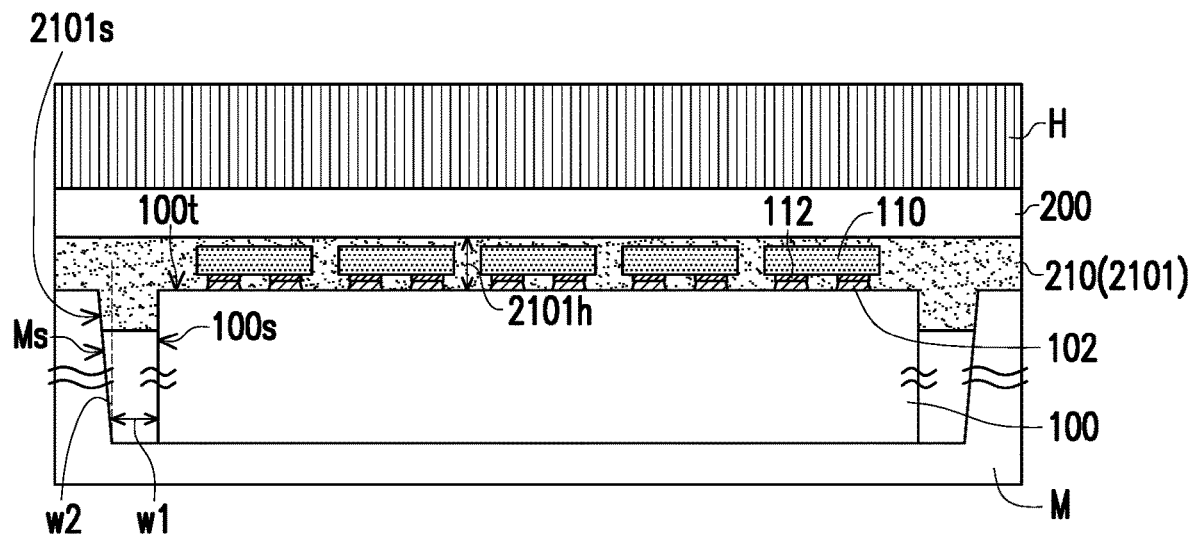
FIG. 7A and FIG. 7B schematically illustrate, in a cross-sectional view, the method for manufacturing a display panel according to another embodiment of this invention.
Figure 7B:
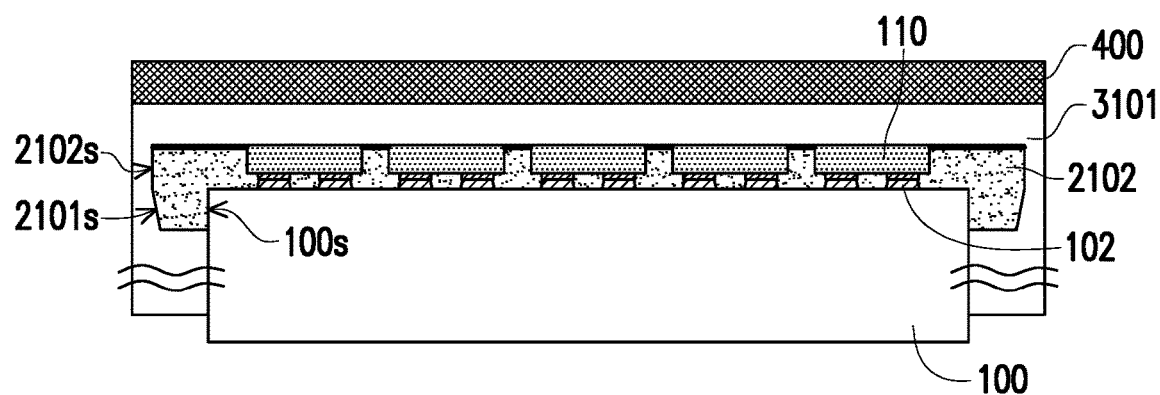

FIG. 7A and FIG. 7B schematically illustrate, in a cross-sectional view, the method for manufacturing a display panel according to another embodiment of this invention. It is particularly noted that the reference characters of elements and related contents in the embodiment as shown in FIGS. 1A to 1K are continued to be used, identical or similar reference characters are used to represent identical or similar elements, and descriptions of identical technical contents are omitted, in this embodiment. The omitted descriptions may refer to the embodiment as shown in FIGS. 1A to 1K.

Referring to FIG. 7A, a process like the process shown in FIGS. 1A to 1D is performed. However, in this embodiment, the inner side surface Ms of the mold M includes an inclined surface, so that the opaque encapsulant layers 210 filling in between the substrate 100 and the mold M has an inclined side surface. In some embodiments, the distance w1 between the inner side surface Ms of the mold M and the side surface 100s of the substrate 100 may range from 50 μm to 200 μm. In some embodiments, the inclination angle w2 of the inner side surface Ms of the mold M ranges from >0° to 6°. The inclination angle w2 may also be called a draft angle.

The opaque encapsulant layers 210 is continued to be heated to be cured, so that a cured opaque encapsulant layer 2101 is formed. The cured opaque encapsulant layer 2101 is mainly located on the first surface 100t of the substrate 100, and surrounds the light-emitting diodes 110. In this embodiment, the side surface 2101s of the cured opaque encapsulant layers 2101 corresponds to the inner side surface Ms of the mold M, and is an inclined surface.

Referring to FIG. 7B, a process like the process shown in FIGS. 1E to 1K is performed to the resulting structure as shown in FIG. 7A to obtain a display panel 50. In this embodiment, the cured opaque encapsulant layer 2102 after the etching process and the cutting process includes a side surface 2102s and the side surface 2101s, wherein the side surface 2102s is a vertical surface made by the cutting, the side surface 2101s is an inclined surface corresponding to the inner side surface of the mold, and the side surface 2101s connects with the bottom of the side surface 2102s. In some other embodiments, the side surface 2101s is removed in the cutting process; in other words, the cured opaque encapsulant layer 2102 may not have the side surface 2101s corresponding to the inner side surface of the mold.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

The invention claimed is:

1. A display panel, comprising:
 a substrate;
 a plurality of light-emitting diodes, disposed on a first surface of the substrate;
 a cured opaque encapsulant layer, disposed on the first surface and a side surface of the substrate and surrounding the light-emitting diodes, wherein a first portion of the cured opaque encapsulant layer is disposed on the side surface of the substrate, and a second surface of the cured opaque encapsulant layer facing away from the substrate is a rough surface; and
 a transparent planarization layer, comprising:
  a first portion covering the second surface of the cured opaque encapsulant layer; and
  a second portion on the side surface of the substrate, wherein the first portion of the cured opaque encapsulant layer is located between the first portion of the transparent planarization layer and the second portion of the transparent planarization layer.

2. The display panel of claim 1, wherein a second portion of the cured opaque encapsulant layer is located between the light-emitting diodes and the substrate.

3. The display panel of claim 1, wherein a roughness Ra of the second surface of the cured opaque encapsulant layer ranges from 0.1 μm to 2.5 μm.

4. The display panel of claim 1, wherein a side surface of the transparent planarization layer is coplanar with a side surface of the cured opaque encapsulant layer.

5. The display panel of claim 1, wherein
the transparent planarization layer is doped with black particles.

6. The display panel of claim 1, wherein the light-emitting diodes are bonded to a plurality of contact pads on the substrate by eutectic bonding.

7. The display panel of claim 1, wherein the second surface of the cured opaque encapsulant layer is lower than top surfaces of the light-emitting diodes, and a height difference between the second surface of the cured opaque encapsulant layer and the top surfaces of the light-emitting diodes is 75 µm or less.

8. The display panel of claim 1, further comprising:
a side trace on the side surface of the substrate,
wherein the first portion of the cured opaque encapsulant layer covers the side trace.

9. A method for manufacturing a display panel, comprising:
disposing a plurality of light-emitting diodes on a first surface of a substrate;
providing an opaque encapsulant layer on the first surface and a side surface of the substrate, wherein the opaque encapsulant layer covers the light-emitting diodes;
curing the opaque encapsulant layer to form a cured opaque encapsulant layer, wherein the cured opaque encapsulant layer surrounds the light-emitting diodes and has a first portion on the side surface of the substrate; and
performing an etching process to etch the cured opaque encapsulant layer, wherein after the etching process, a second surface of the cured opaque encapsulant layer facing away from the substrate is a rough surface; and
forming a transparent planarization layer, wherein the transparent planarization layer comprises:
a first portion covering the second surface of the cured opaque encapsulant layer; and
a second portion on the side surface of the substrate, wherein the first portion of the cured opaque encapsulant layer is located between the first portion of the transparent planarization layer and the second portion of the transparent planarization layer.

10. The method of claim 9, further comprising:
heat-pressing the opaque encapsulant layer, whereby the opaque encapsulant layer fills in between the light-emitting diodes and the substrate.

11. The method of claim 9, wherein
a side surface of the transparent planarization layer is coplanar with a side surface of the cured opaque encapsulant layer.

12. The method of claim 9, wherein the disposing the plurality of light-emitting diodes on the first surface of the substrate comprises: bonding the light-emitting diodes to a plurality of contact pads on the substrate by eutectic bonding.

13. The method of claim 9, further comprising:
forming a side trace on the side surface of the substrate; and
providing the opaque encapsulant layer also on the side surface of the substrate, wherein the opaque encapsulant layer on the side surface of the substrate covers a part of the side trace.

14. The method of claim 9, further comprising:
before providing the opaque encapsulant layer on the first surface and the side surface of the substrate, placing the substrate and the light-emitting diodes into a mold.

15. The method of claim 9, wherein the opaque encapsulant layer comprises a B-stage resin.

\* \* \* \* \*